(12) United States Patent
Hershberger et al.

(10) Patent No.: US 7,109,584 B2
(45) Date of Patent: Sep. 19, 2006

(54) DENDRITE GROWTH CONTROL CIRCUIT

(75) Inventors: Douglas B. Hershberger, Essex Junction, VT (US); Steven H. Voldman, South Burlington, VT (US); Michael J. Zierak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/904,680

(22) Filed: Nov. 23, 2004

(65) Prior Publication Data

US 2006/0110909 A1   May 25, 2006

(51) Int. Cl.
*H01L 23/48* (2006.01)
*H01L 23/52* (2006.01)
*H01L 29/40* (2006.01)

(52) U.S. Cl. .................. 257/751; 257/753; 438/222

(58) Field of Classification Search ................ 257/751, 257/753; 438/222, 652, 687, 691, 963
See application file for complete search history.

(56) References Cited

U.S. PATENT DOCUMENTS 4,874,711 A * 10/1989 Hughes et al. ............... 438/10
6,074,949 A    6/2000 Schounauer et al.
6,162,727 A   12/2000 Schounauer et al.
6,177,349 B1   1/2001 Schounauer et al.
6,197,690 B1   3/2001 Schounauer et al.
6,207,569 B1   3/2001 Schounauer et al.
6,319,833 B1  11/2001 Schounauer et al.
6,596,637 B1   7/2003 Schounauer et al.

* cited by examiner

*Primary Examiner*—Phuc T. Dang
(74) *Attorney, Agent, or Firm*—Anthony Canale Esq.; Greenblum & Bernstein, P.L.C.

(57) ABSTRACT

A circuit is provided which prevents dendrite formation on interconnects during semiconductor device processing due to a dendrite-forming current. The circuit includes a switch located in at least one of the dendrite-forming current paths. The switch is configured to be open or in the "off" state during processing, and is configured to be closed or in the "on" state after processing to allow proper functioning of the semiconductor device. The switch may include an nFET or pFET, depending on the environment in which it is used to control or prevent dendrite formation. The switch may be configured to change to the "closed" state when an input signal is provided during operation of the fabricated semiconductor device.

7 Claims, 11 Drawing Sheets

DENDRITE GROWTH CONTROL CIRCUIT

FIELD OF THE INVENTION

The invention relates to semiconductor device fabrication, and more particularly to controlling or preventing dendrite growth between interconnects during semiconductor device fabrication.

BACKGROUND DESCRIPTION

Under some circumstances, dendrites of conductive material may be formed between metal or other conductive material interconnects during fabrication of a semiconductor device. For example, where copper lines are formed by a damascene process, a polishing step is utilized to planarize the surface of the layer holding the damascene-formed lines. Typically, the polishing step involves a slurry incorporating a grinding compound and/or chemical. The polishing process accordingly will produce small particles of the material being ground away which will remain suspended in the slurry. Consequently, the interconnect being polished will be immersed in a slurry having conductive particles suspended therein.

Under certain conditions, a voltage potential may appear across some or all of the interconnects. This voltage potential, in conjunction with chemical activity associated upon the interconnects in the slurry may cause a dendrite of conductive material to form on at least one of the interconnects. Additionally, such a dendrite may grow towards another interconnect and ultimately, make electrical contact with the other interconnect.

The interconnect towards which the dendrite grows will have a voltage potential opposite to the voltage potential of the interconnect producing the dendrite. The voltage potential on each interconnect driving the dendrite growth is produced by, for example, the structure of the device to which the interconnects connects are connected, and may not be necessarily directly related to the process at the device's surface.

Such a dendrite then would form a short between the interconnects which otherwise should be insulated from one another. The shorted interconnects then impair circuit functioning.

SUMMARY OF THE INVENTION

In a first aspect of the invention, a method of controlling interconnect dendrite growth during interconnect processing includes arranging a semiconductor switch in a dendrite-forming current path, and configuring the semiconductor switch in the "off" state during interconnect processing.

In another aspect of the invention, a method of controlling interconnect dendrite growth includes arranging a first source/drain region of a semiconductor switch in electrical communication with a first side of a charge source, and arranging a gate region of the semiconductor switch in electrical communication with a second side of the charge source. The method also includes arranging a second source/drain region of the semiconductor switch in electrical communication with a dendrite forming conductor.

In another aspect of the invention, a dendrite control circuit includes a first source/drain region of a semiconductor switch in electrical communication with a first side of a charge source, and a gate region of the semiconductor switch in electrical communication with a second side of the charge source. The circuit also includes a second source/drain region of the semiconductor switch in electrical communication with a dendrite forming conductor.

DETAILED DESCRIPTION OF EMBODIMENTS OF THE INVENTION

The invention relates to, for example, a structure and method for controlling or preventing dendrite growth between interconnects during semiconductor fabrication. In the embodiments of the invention, a circuit is provided for breaking the current flow path which contributes to dendrite formation. Thus, by controlling or preventing dendrite formation, it is possible to prevent shorts in the circuit. Accordingly, embodiments of the invention include a circuit, such as a switch or back-to-back diodes, for breaking the current flow path which contributes to dendrite formation while the semiconductor device is being processed. The circuit is configured so that the circuit is open during device fabrication and closed during operation of the semiconductor device. The circuit may be referred alternatively as a "dendrite control network," a "dendrite control circuit," a "photo-induced well charging prevention network," or other similar term which indicates a circuit configured to reduce or prevent dendrite formation during device fabrication.

Figure 1:
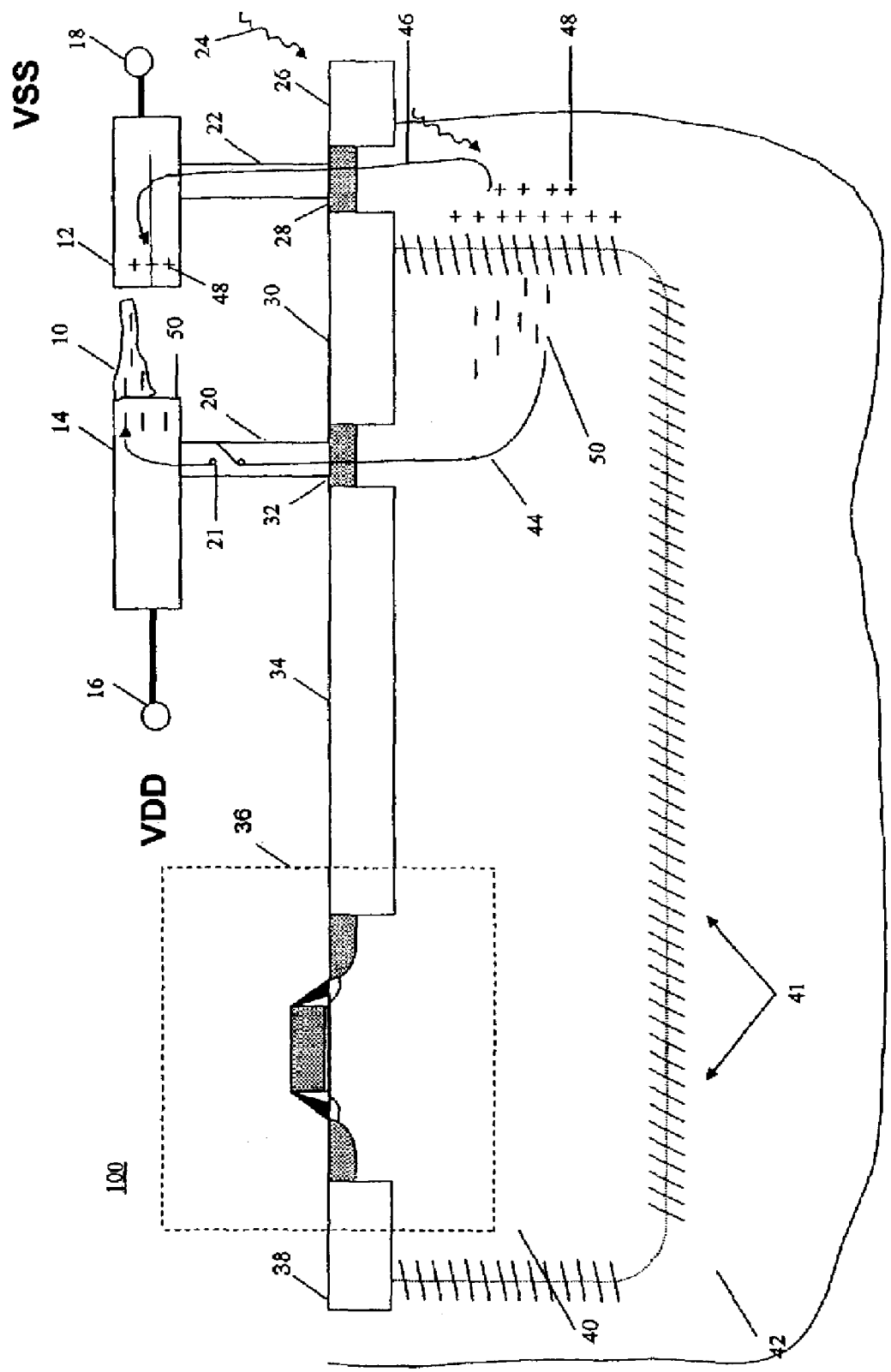
FIG. 1 is a conceptional illustration of an embodiment of a dendrite formation control circuit in accordance with the invention.

FIG. 1 is an illustration of a semiconductor device 100 configured to allow interupting the dendrite-forming current. FIG. 1 may be used as an exemplary embodiment when describing the embodiments of, for example, FIGS. 2–4.

The semiconductor device 100 includes a substrate 42 having an N-well 40 therein. The substrate 42 and an N-well 40 are formed at an interface or semiconductor junction 41. Shallow trench isolations (STI) 26, 30, 34, and 38 are formed in the N-well 40 and substrate 42. Also a P+ contact 28 and an N+ contact 32 are formed on the N-well 40 and substrate.

A semiconductor device 36 is formed between the STI 34 and STI 38. The semiconductor device 36 may be any type of suitable semiconductor device intended to be connected to a VDD input 16 and a VSS input 18. A metal line 22 leading to an interconnect 12 is attached to the P+ contact 28. The interconnect 14 is the input for VSS 18. A second metal line 20 is attached to the N+ contact 32, which leads to a second interconnect 14. The second interconnect 14 leads to the VDD input 16. These features are all formed using standard fabrication processes as should be well known in the art, and, as such, a detailed discussion of the fabrication process is not required to understand and practice this invention.

In this and other examples, the semiconductor junction may have a photovoltaic effect such as that found in a solar cell. Accordingly, when photons 24 strike the semiconductor junction 41, charge is formed with negative charge 50 being generated on the N-well 40 side of the interface 41 and positive charge 48 being generated on the substrate 42 side of the interface 41. The negative charges 50 may distribute themselves along current flow path 44 which passes through the N-well 40, the N+ contact 32, the second metal line 20 to the second interconnect 14. Additionally, the positive charges 48 may be allowed to distribute themselves along the current flow path 46 along the substrate 42, P+ contact 28, first metal line 22 and first interconnect 12.

With charge being generated at the semiconductor junction 41, and being allowed to freely move along the current flow paths, 44 and 46, opposite charges collect at the first and second interconnects, 12 and 14, respectively. With charge collected at the first and second interconnects, 12 and 14, a dendrite 10 may form on one of the interconnects while the interconnects are being polished.

Accordingly, embodiments of the invention include inserting a switching device 21 in one of the current flow paths, 44 and 46, to interrupt the flow of dendrite-forming current. In this example, the switching device 21 is inserted in the negative charge flow path 44. It should be understood that the invention would function equally well if a switching device 21 was (i) inserted in the positive charge current flow path 46 as well as (ii) inserted into both negative charge and positive charge current paths, 44 and 46.

In operation, the switch 21 is positioned in the "open," or "off" state during processing to block dendrite-forming current. Once processing of the interconnects is complete, and there is no more tendency for charge to collect on the interconnects, 12 and 14, and form a dendrite, the switch 21 may be closed or put in the "on" state. Typically, the switch 21 would be closed when the completed device 100 is put into operation.

The voltage potential shown in the semiconductor device 100 example is a photo-induced voltage potential. However, any voltage potential which drives charge to the interconnects may cause dendrite formation on the interconnects, and such dendrite formation may be controlled or prevented using a switching device in accordance with the invention to interrupt at least one of the current flow paths. However, for explanation purposes, an exemplary photo induced voltage potential will be used herein.

Figure 2:
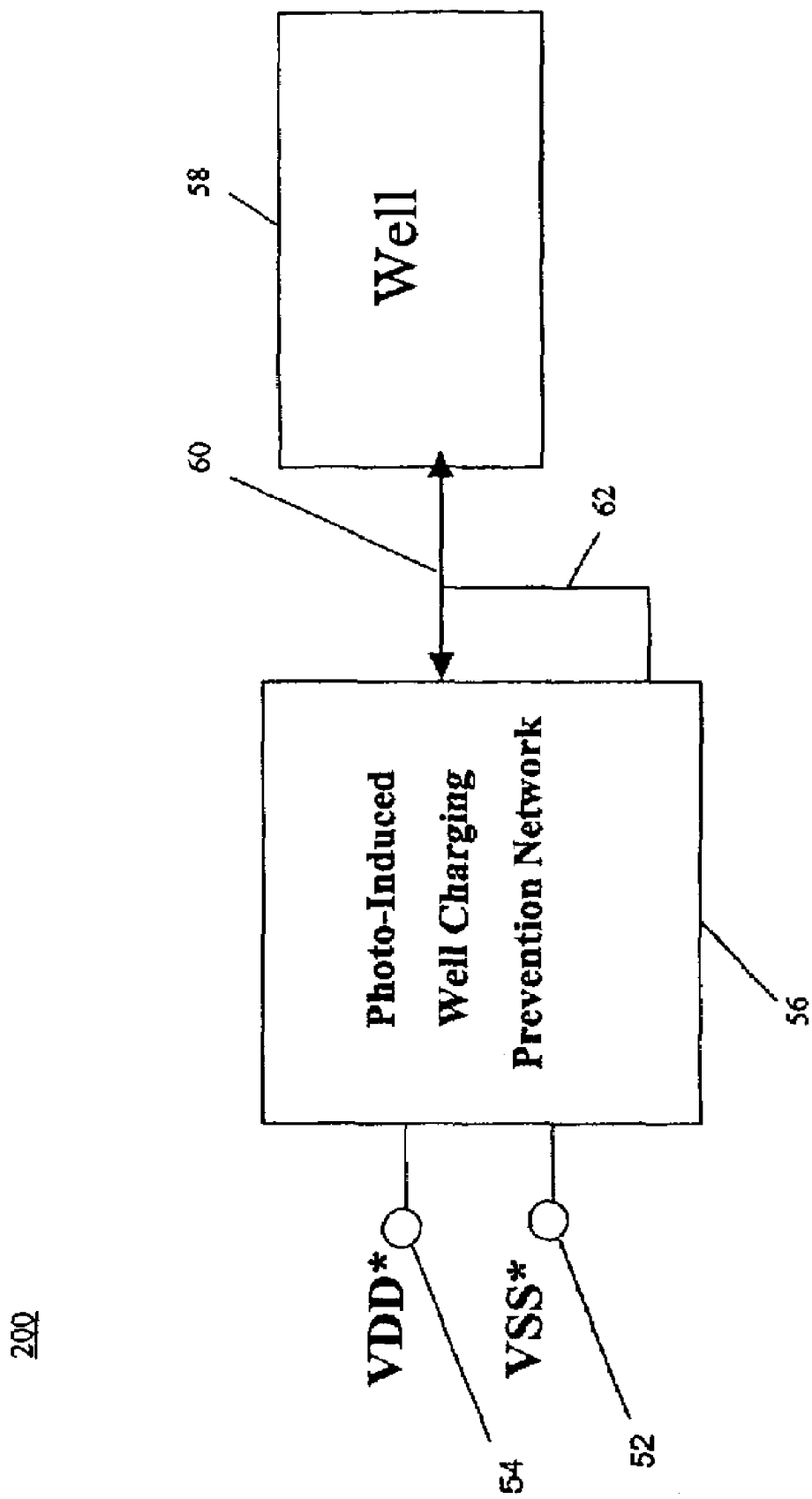
FIG. 2 is a schematic illustration of a photo-induced well charging network in accordance with the invention.

Referring to FIG. 2, a schematic of a photo-induced well charging prevention network 200 is shown. The charging prevention network 200 includes a VSS* input 52, and a VDD* input 54. VSS* and VDD* include voltages at VSS and VDD, respectively, as well as voltages at a lower or other potential. Both the VSS* input 52 and the VDD* input 54 are coupled to a photo-induced well charging prevention network 56. As an example, a photo-induced well charging prevention network may include a switch, a diode, or a transistor-like device configured to function as a switch. The photo-induced well charging prevention network 56 is coupled to a well 58 through line 60. Additionally, the photo-induced well charge prevention network 56 is coupled to the line 60 through a second line 62.

The schematic 200 shows how the photo-induced well charging prevention network 56 is inserted between the well 58 which is the source of the photo-induced charge and interconnects having the inputs VSS* and VDD*, 52 and 54, respectively. Additionally, the photo-induced well charging prevention network 56 has a control line 62 which controls the "on/off" state of the photo-induced well charging prevention network 56.

In operation, the photo-induced well charging prevention network 56 blocks charge traveling between the well 58 and either one or both of the interconnects of the VSS* input 52 and VDD* 54 input during semiconductor device fabrication. Once the critical step of semiconductor fabrication device which tends to form dendrites is complete, the photo-induced well charging prevention network 56 may be positioned in the "on" state. Typically, the photo-induced well charging prevention network 56 is positioned in the "on" state when the semiconductor device is put into operation.

Embodiments of the invention include isolated and non-isolated well control network structures, which do not necessarily use P-well and N-well connections and copper interconnects. Traditionally, a non-isolated well control network allows floating during processing and biasing during device operation when connected and disconnected, respectively.

Figure 3:
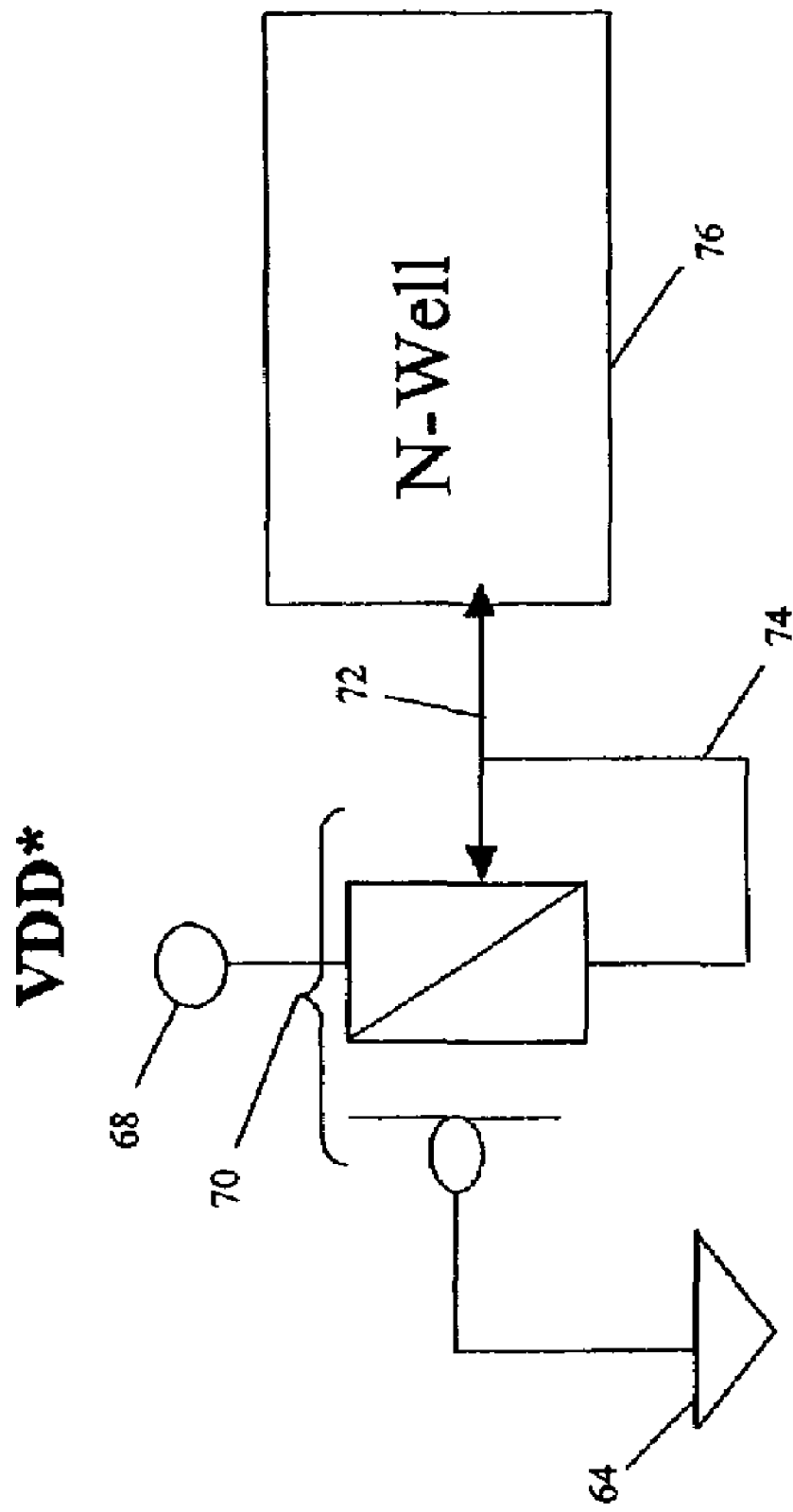
FIG. 3 is a schematic illustration of a photo-induced well charging prevention network for an N-well or tub in accordance with the invention.

Referring to FIG. 3, a schematic of a photo-induced well charging prevention network 300 for an N-well or tub is shown. The photo-induced well charging prevention network 300 for the N-well or tub includes a VDD* input 68, and a ground connection 64. The VDD* input 68 is connected to a source/drain region of a FET 70. The ground 64 is connected to the gate of the FET 70. The N-well 76 is connected to a source/drain region of the FET 70 through connection 72. Additionally, a source/drain region of the FET 70 is connected to the N-well 76 through connection 74.

In operation, the FET 70 is configured to function as an open switch to interrupt dendrite-forming current flowing along the connection 72 from the N-well 76 during processing, thus, preventing dendrite formation. After processing, the FET 70 is configured to change to the "on" or "closed" state upon the application of an input voltage to the VDD* input 68.

Figure 4:
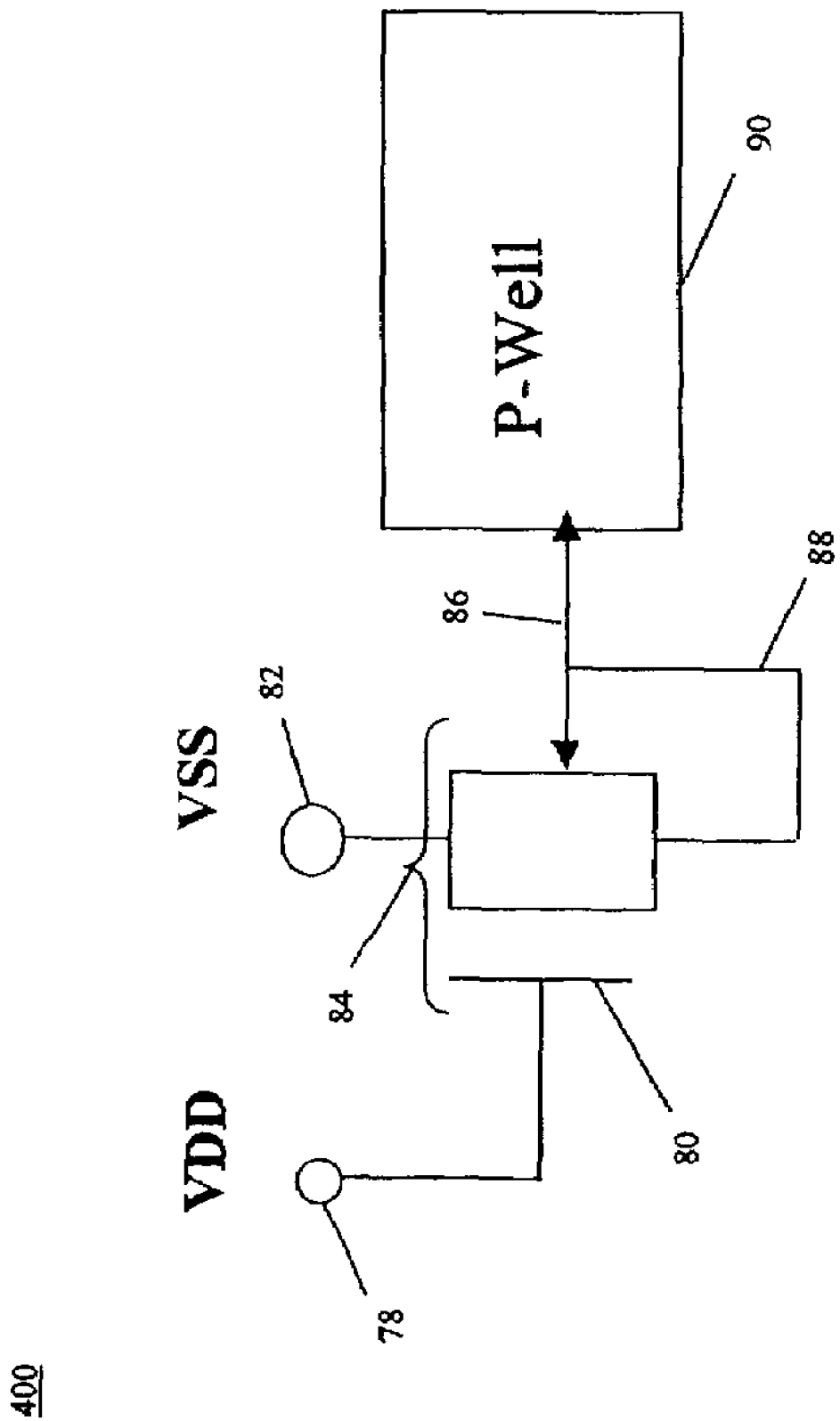
FIG. 4 is a schematic illustration of a photo-induced well charging prevention network for a P-doped isolated region in accordance with the invention.

Referring to FIG. 4, a schematic of a photo-induced well charging prevention network 400 for a P-doped isolated region is shown. The photo-induced well charging prevention network 400 includes a VDD input 78 and a VSS input 82. The VDD input 78 is connected to a gate of a FET 84 and the VSS input 82 is connected to a source/drain region of the FET 84. Additionally, a P-well 90 is connected to a source/drain region of the FET 84 through connection 86. A source/drain region of the FET 84 is connected to the FET 84 through connection 86. The FET 84 is also connected to the connection 86 through a connection 88.

In operation, the FET 84 interrupts the flow of dendrite-forming charge between the P-well 90 and either or both the VSS input 82 and VDD input 78. Additionally, the FET 84 is configured to turn "on" when the semiconductor device incorporating the photo-induced well charging prevention network 400 receives a VSS input signal at input 82.

Figure 5:
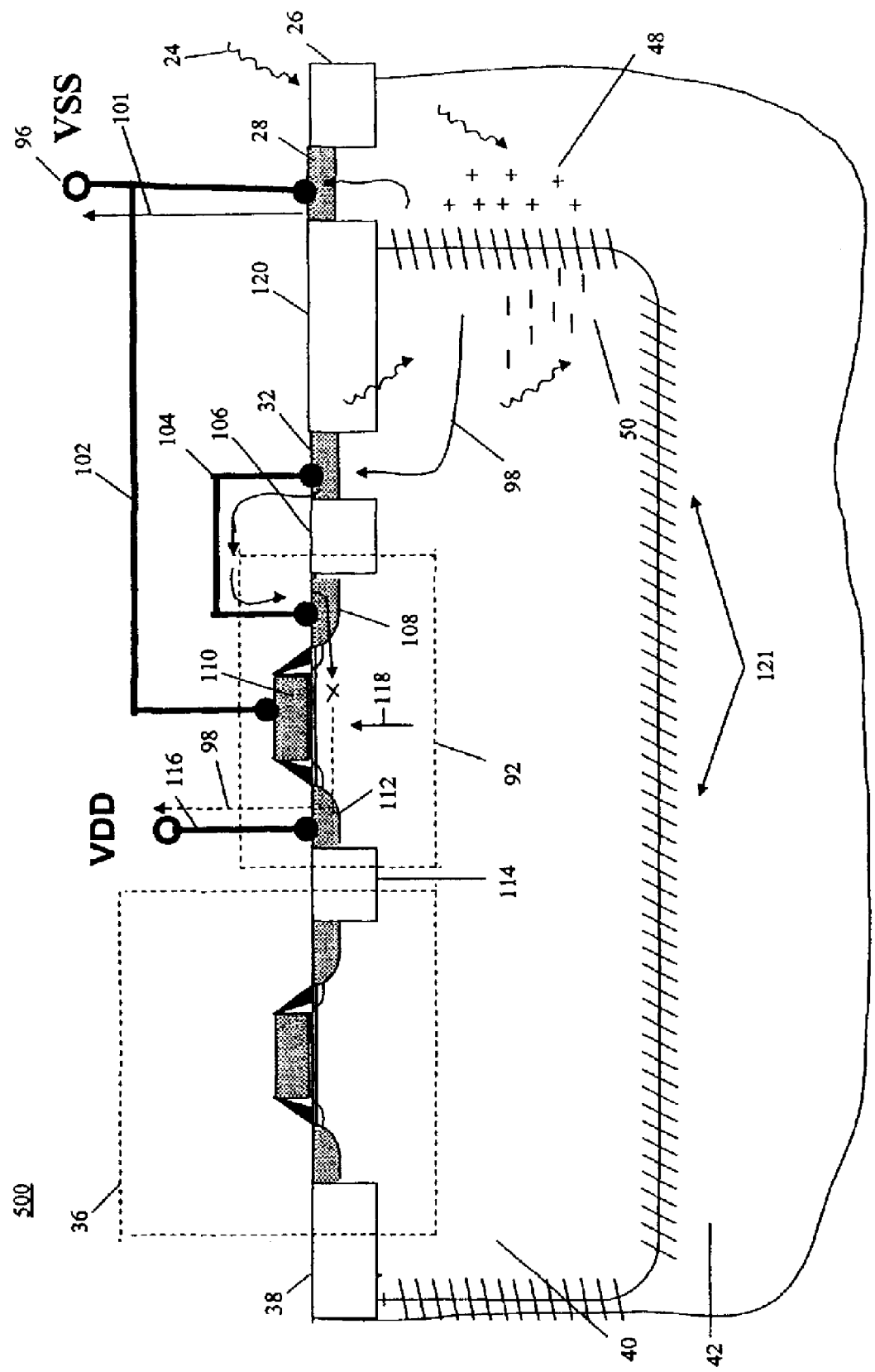
FIG. 5 is a schematic illustration of a non-isolated well charging control network in accordance with the invention.

Referring to FIG. 5, an embodiment of a non-isolated well charging control network 500 is shown. The non-isolated well charging control network 500 includes a substrate 42 with an N-well 40 formed therein. An interface or semiconductor junction 121 is formed at the interface of the N-well 40 and the substrate 42. Formed across the top of the substrate 42 and N-well 40 are STI 26, 120, 106, 114, and 38. Also formed at the top of the substrate 42 is a P+ contact 28. At the top of the N-well 40 is an N+ contact 32.

Between the STI 106 and the STI 114 is a pFET 92. The pFET 92 includes a source 108 next to the STI 106, and a drain 112 next to the STI 114. Between the drain and the source, 112 and 108, is a gate 110. A gate input 102 connects the P+ contact 28 to the gate 110 of the pFET 92 and VSS 96. Gate input 102 connects to the gate 110 of the pFET 92 and is configured to bias the pFET 92 into the "on" state during operation of the circuit and thus substantially no current flows through the gate input 102 during circuit operation. A source connection 104 connects the N+ contact 32 to the source 108 of the pFET 92. Additionally, a drain input 116 provides a connection to VDD to the drain 112. Between the STI 114 and STI 38 is a second semiconductor device 36.

The semiconductor device 500 will tend to produce charge carriers along the interface 121 between the substrate 42 and the N-well 40 when photons 24 interact with the semiconductor junction 121. Thus, positive charges 48 will be produced in the substrate 42 and negative charges 50 will be produced in the N-well 40. Such charges have the potential to form dendrites on some or all of the interconnects which may receive such charge during processing.

In this embodiment, a dendrite forming current of the positive charges 48 would pass along current flow path 101 from the junction 121 to VSS 96 without well isolation. Additionally, the negative charge 50 would flow along a current flow path 98 through the N+ contact 32 and the source connection 104 to the source 108 of the pFET 92. The current would then flow through the N-well 40 to the P+ contact 112 and to VDD 116 to form a dendrite from VDD 116 to VSS 96. However, with VDD 116 attached to the N-well 40 through P+ contact 112, a back-to-back diode structure is formed which functions as a reverse bias diode junction during fabrication to interrupt the dendrite-forming current. In other words, with the pFET 92 configured as shown, the pFET 92 will be in the "off" state during fabrication and thus will not conduct charge across the active region of the pFET 92 to the drain 112. Accordingly, any dendrite-forming current is interrupted, thus, reducing and/or preventing dendrite formation on the interconnect VDD 116.

The source connection 104 may be any type of electrical connection connecting the N+ contact 32 to the source 108 of the pFET 92. In embodiments, the source connection 104 is positioned on a metallization layer different from the gate contact 102. Such positioning avoids dendrite formation between unswitched portions of the source connector 104 and the gate connector 102. Additionally, the source connector 104 could be formed from any suitable conductor which does not form dendrites in order to avoid dendrite formation between the source connector 104 and the gate connector 102. This may include, for example, silicide.

In operation, during processing, charge generated at the interface 121 flows along current flow path 101 to the gate 110 of the pFET 92. Additionally, charge flows along current flow path 98 through the N+ contact 32 and connector 104 to the source 108 of the pFET 92. However, during fabrication, the pFET 92 is in the "open" state and thus charge cannot flow to the VDD interconnect 116. By blocking charge from the VDD interconnect 116, dendrite growth thereon is prevented. After fabrication, pFET 92 will transition to the "closed" state when the input VDD interconnect 116 receives an input signal.

It should be understood that, in general, the circuit configuration allows well contact to be made locally through FET, which may function as a switch, without the well contact being in physical contact with a Cu Wire. Removing the physical contact between the Cu wire and the well contact prevents dendrite formation by substantially blocking the built-in potential of the charge producing "photodiode-like" junction to reach the Cu wire. The well biasing circuit configuration places the well bias voltage coming from the Cu wire on a region which is oppositely doped from the well, and introduces a reverse biased diode in the path of dendrite forming current during CMP. The FET is then used as a switch to bias the well correctly after all processing is finished. It should also be understood that the FET does not necessarily need to be "on" or "off" during operation of the device, but can be dynamically biased during chip operation to vary the potential on the well.

Figure 6:
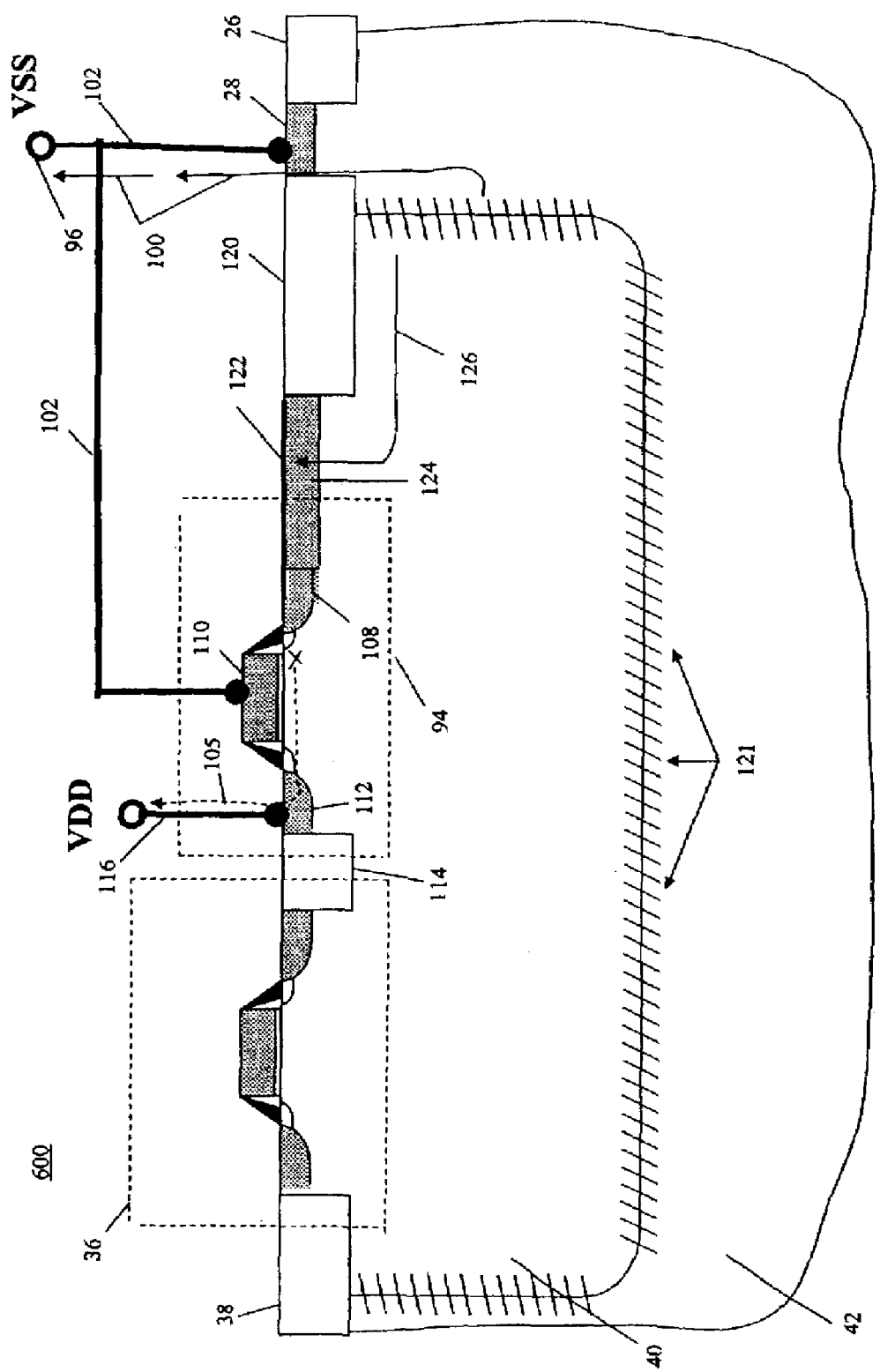
FIG. 6 is an illustration of a semiconductor device showing a non-isolated well charging control network in accordance with the invention.

Referring to FIG. 6, a semiconductor device 600 showing a non-isolated well charging control network is shown. The semiconductor device 600 includes a substrate 42 with an N-well 40 formed therein. A semiconductor junction 121 is formed at the interface of the substrate 42 and the N-well 40. Formed across the top of the substrate 42 and N-well 40 are STIs 26, 120, 114, and 38. Between the STI 26 and 120 is a P+ contact 28. To the side of the STI 114 is a pFET 94. Between the STI 114 and the STI 38 is a semiconductor device 36.

The pFET 94 includes a source 108, a gate 110, and a drain 112. Between the source 108 and the STI 120 is an extended N+ contact 124. The extended N+ contact 124 butts against the source 108 of the pFET 94. A conductor 122 contacts the top of the source 108 and the extended N+ contact 124. The conductor 122 can be formed of any suitable conductor material such as a metal or a silicide layer. A gate connector 102 extends from the P+ contact 28 to the gate 110 of the pFET 94.

The combination of the conductor 122 and the extended N+ contact 124 function to electrically connect charges produced in the N-well 40 at the interface 121 to the source 108 of the pFET 94 in a manner similar to the source connector 104 of FIG. 5. Thus, the pFET 94 interrupts the flow of dendrite-forming current from the semiconductor junction 121 when in the "open" state during device fabrication. However, Gate input 102 connects to the gate 110 of the pFET 94 and is configured to bias the pFET 94 into the "on" state during operation of the circuit and thus substantially no current flows through the gate input 102 during circuit operation.

In operation, during processing, a dendrite forming charge may be generated along the interface 121. Such charge flows to VSS 96 through the current flow path 100. Additionally, charge generated at the interface 121 passes through the N+ well 40 and into the extended N+ contact 124. From the N+ extended contact 124, charge passes through the conductive layer 122, and to the source 108 of the pFET 94. The current would then flow through the N-well 40 to the P+ contact 112 and to VDD 116 to form a dendrite from VDD 116 to VSS 96. However, with VDD 116 attached to the N-well 40 through P+ contact 112, a back-to-back diode structure is formed which functions as a reverse bias diode junction during fabrication to interrupt the dendrite-forming current. In other words, with the pFET 94 configured as shown, the pFET 94 is in the "off" state during fabrication, current cannot pass through the active region of the pFET 94 to reach the VDD input 116. Accordingly, dendrite-forming current is blocked from the VDD input 116 and no dendrite can form during fabrication. After fabrication, the pFET 94 transitions to the "on" state when the VDD input 116 receives an input signal.

Figure 7:
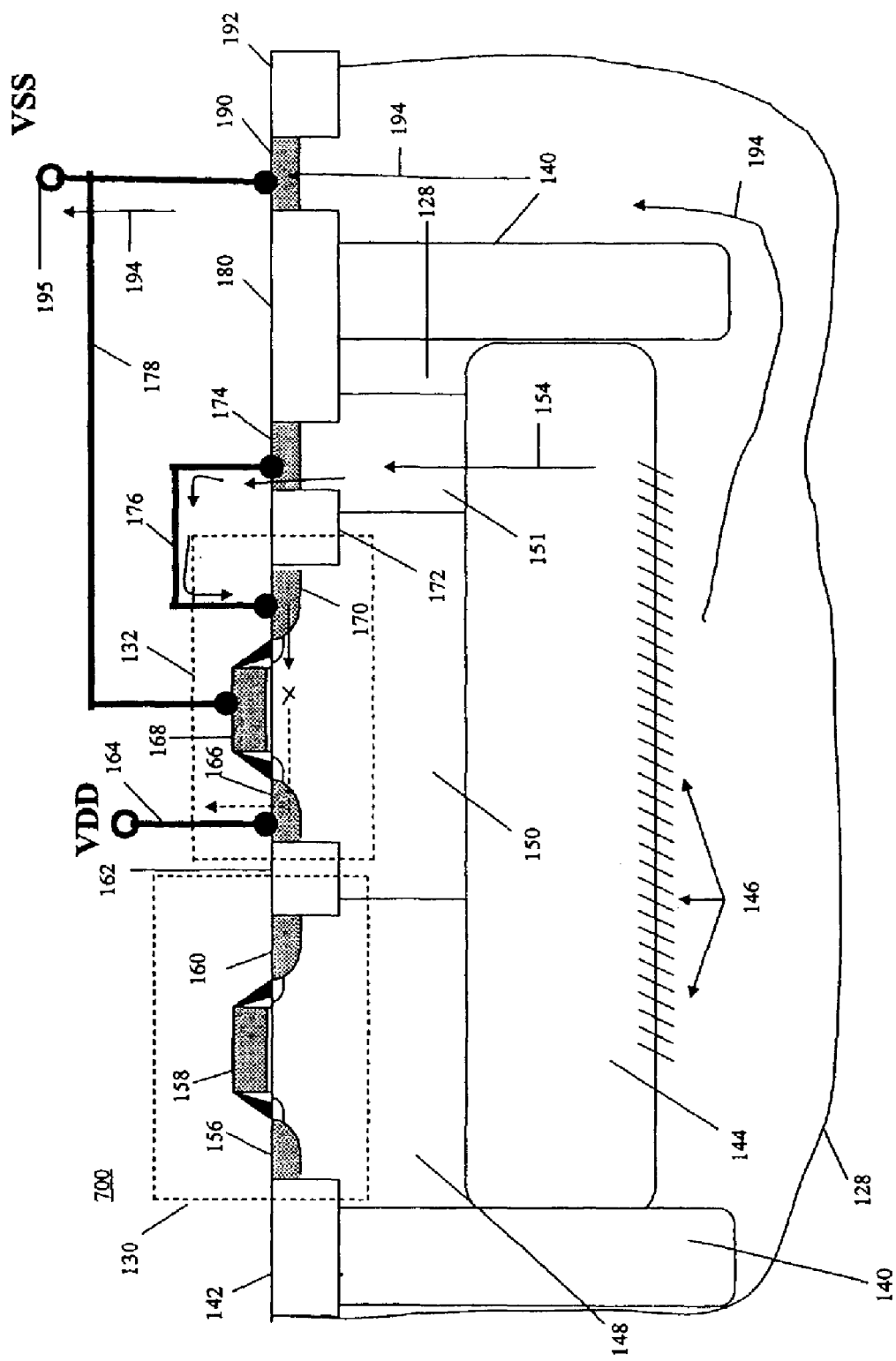
FIG. 7 is an illustration of a semiconductor device having an isolated well charging control network in accordance with the invention.

Referring to FIG. 7, a semiconductor device 700 having an isolated well charging control network is shown. The semiconductor device 700 includes a substrate 128. An N+ well 144 is formed within the substrate 128. The N+ well 14 may also be referred to as a "sub-collector" or "buried layer," as well. The N+ well 144 can be formed within the substrate by any of the doping methods well known in the art for forming N+ wells. The N+ well 144 and substrate 128 form a semiconductor junction 146. On either side of the N+ well 144 are deep trench isolations 140, which can be formed in the substrate 128 by any of the methods well known in the art for forming deep trench isolations such as by reactive ion etching (RIE). A P-well 148 is formed next to the deep trench isolation 140 and the N+ well 144. An N-well 150 is formed next to the P-well 148 and the N+ well 144. Next to the N-well 150 on top of the N+ well 144 is a reach-through 151. The P-well 148, N-well 150 and reach-through 151 can be formed within the substrate 128 by any of the methods well known in the art for forming the respective features.

Formed in the substrate is a STI 192 and STI 142. Formed on top of the P-well 148 is a semiconductor device 130, and formed on top of the N-well 150 is a pFET 132. A STI 180, a STI 172, and the STI 162 are positioned at the top of the P-well 148, N-well 150 and reach-through 151, respectively. A P+ contact 190 is positioned between the STI 192 and the STI 180. An N+ contact 174 is positioned between the STI 180 and the STI 172.

The pFET 132 includes drain 166, a gate 168 and source 170. A connector 164 connects the drain 166 to a VDD input. A gate connector 178 connects the P+ contact 190 to the gate 168 of the pFET 132. Gate connector 178 connects VSS 195 to the gate 168 of the pFET 132 and is configured to bias the pFET 132 into the "on" state during operation of the circuit and thus substantially no current flows through the gate connector 178 during circuit operation. A source connector 176 connects the N+ contact 174 to the source 170 of the pFET 132.

During fabrication, when photons strike the semiconductor junction 146, charge is generated at the semiconductor junction 146. Negative charge flows along the charge flow path 154 through the N+ well 144 and into the reach-through 151. From the reach-through 151, the current flow path passes through the N+ contact 174 and into the source connector 176 and source 170 of the pFET 132. A second current flow path 194 flows from the semiconductor junction 146 through the substrate 128 and into the P+ contact 190. From the P+ contact 190 current path passes to the VSS contact 195.

In operation, during processing, any charge, which may flow along the first charge flow path 154 into the source 170 of the pFET 132, is blocked at the active region of the pFET 132 because the pFET is in the "open" state. Thus, no dendrite will form on the VDD input 164. After processing, the pFET 132 is configured to automatically turn "on" when the VDD contact 164 receives a signal. In other words, with VDD 164 attached to the P-well 150 through P+ contact 162, a back-to-back diode structure is formed by the pFET 132 which functions as a reverse bias diode junction during fabrication to interrupt the dendrite-forming current.

Figure 8:
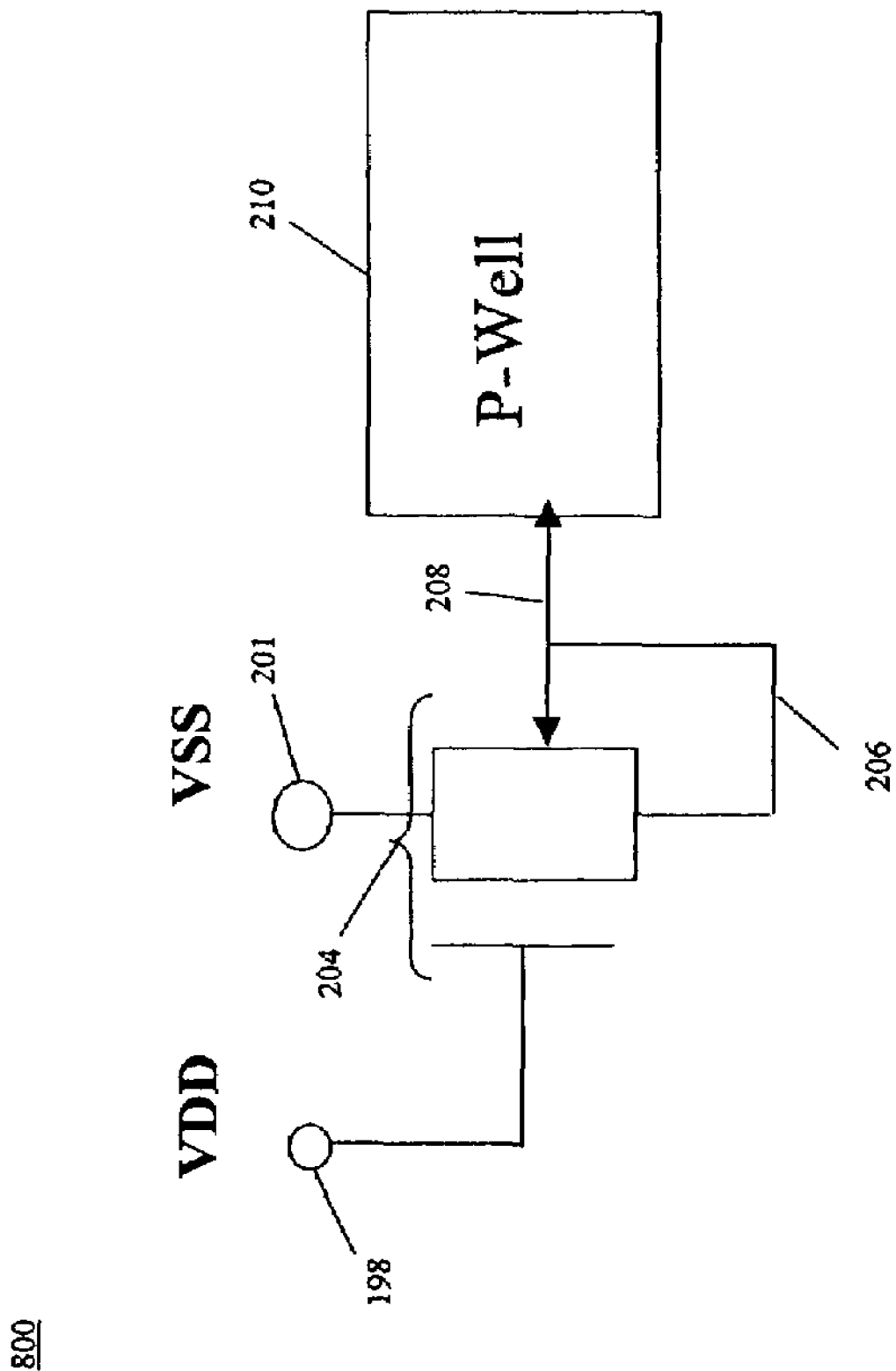
FIG. 8 is an illustration of a photo-induced well charging prevention network for a P-doped isolated region in accordance with the invention.

Referring to FIG. 8, a schematic illustration of a photo-induced well charging prevention network 800 for a P-doped isolated region is shown. The schematic shows a VDD input 198 and a VSS input 201 into a FET 204. A P-well 210 has a connection 208 to the FET 204. Another connection 206 leads from the FET 204 to the connection 208.

In operation, the FET 204 serves to interrupt the current flow path between charged produced in the P-well 210 and either the VDD 198 or the VSS input 201. Furthermore, the FET 204 is configured to turn to the "on" state using the connector 206 when a signal is applied to the VSS input 201 after fabrication. This controls or prevents dendrite formations.

Figure 9:
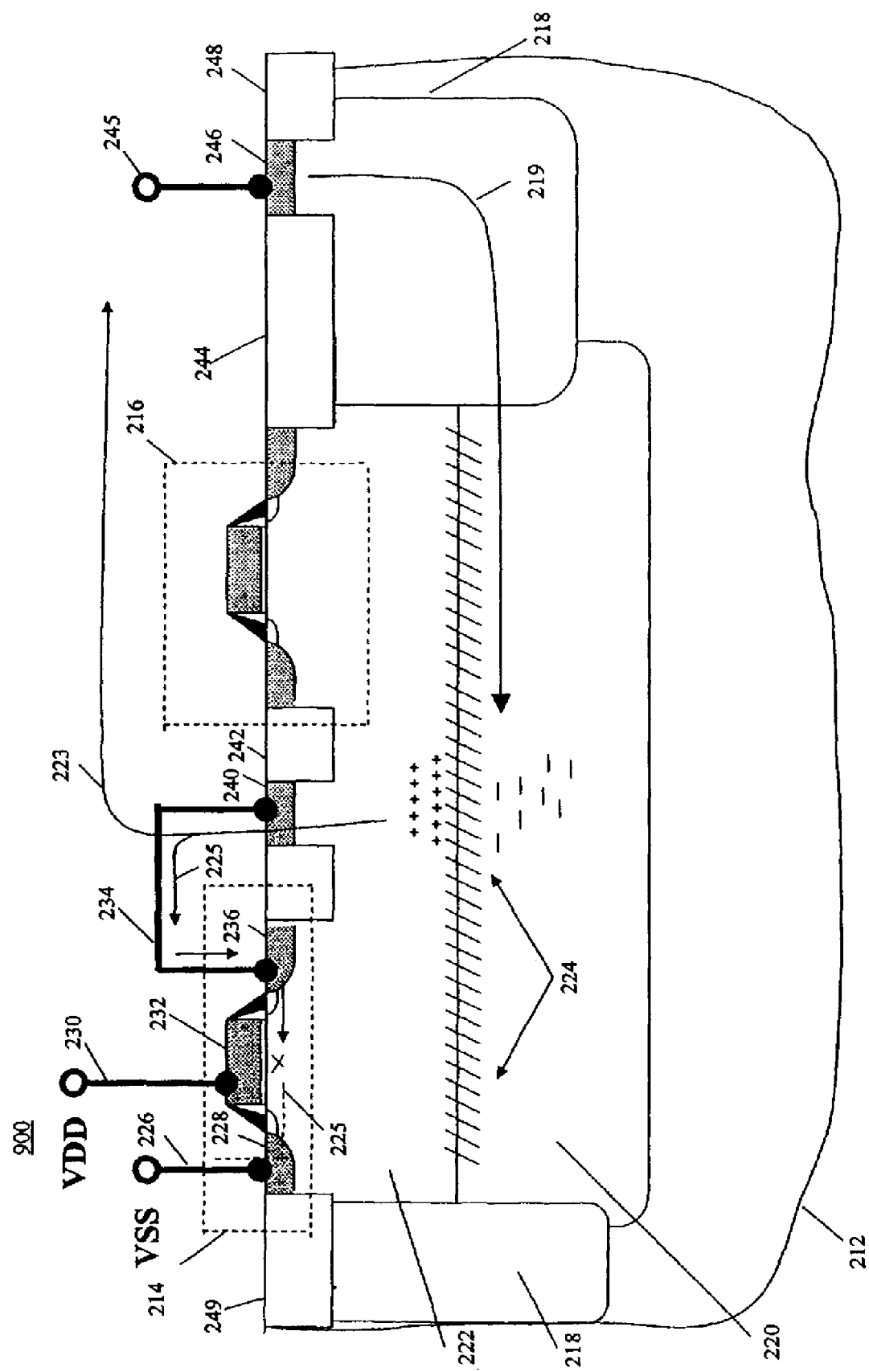
FIG. 9 is an illustration of a semiconductor device having an isolated well charging control network in accordance with the invention.

Referring to FIG. 9, a semiconductor device 900 having an isolated well charging control network is shown. The semiconductor device 900 includes a substrate 212. Formed within the substrate 212 is an N-band 220 with a P-well 222 above the N-band 220. At the interface between the P-well 222 and N-band 220 is formed a semiconductor junction 224. On either side of the N-band 220 is an N-well 218. Formed on the substrate 212 is a STI 248 and formed on the side of the N-well 218 is a STI 249.

A STI 244 is formed proximate the side of the N-well 218. To the side of the STI 244 is a semiconductor device 216. Formed proximate the other side of the semiconductor device 216 is a STI 242. To the side of the STI 242, formed on the top of the P-well 220, is a P+ contact 240, and to the side of the P+ contact 240 on the top of the P-well 222 is a STI 238. Between the STI 238 and the STI 249 is an nFET 214.

The nFET 214 includes a source 228, a gate 232, and a drain 236. A VSS input 226 is connected to the source 228 and a VDD input 230 is connected to the gate 232. Additionally, a drain connector 234 connects between the P+ contact 240 and the drain 236. It should be noted that this drain connector 234 may include a conductor connection directly between the P+ contact 240 and the drain 236 with the STI 238 removed therebetween with a conductor on top.

When photons or other forms of radiation contact the semiconductor junction 224, a potential current flow path 223 would be created which runs from the semiconductor junction 224 through the P+ contact 240 to the N+ contact 246. The N+ contact 246 is connected to an isolation contact 245. A current 219 through the substrate 212 would also run from the N+ contact 246 through the N-well 218 to the semiconductor junction 224. However, the addition of the FET 214 allows contact to the P-well 222 through the P+ contact 240 to be made locally through the FET 214 without the P-well contact 222 being in physical contact with a Cu wire which would be formed on an upper level and potentially cause a dendrite to form therefrom.

Consequently, the combination of the N+ contact 236, the active region of the FET 214 and the N+ contact 228 form a back-to-back diode structure which functions as a reverse bias diode junction during fabrication to interrupt dendrite-forming current which would otherwise flow along current flow path 225. In other words, FET 214 laces well bias voltage which would come from a Cu wire during processing due to photon-induced charge production at the semiconductor junction 224 on a region which is oppositely doped from the P-well 222. Thus, a reversed biased diode is placed in the path of a dendrite forming current during the CMP step of the Cu wire formation on an upper level. The FET 214 may then be used as a switch to bias the P-well 222 correctly after processing is complete, and there is no longer a chance of forming a dendrite on the Cu wire. It should be understood that the FET 214 may be dynamically biased during chip operation to vary the Potential on the P-well 222.

Figure 10:
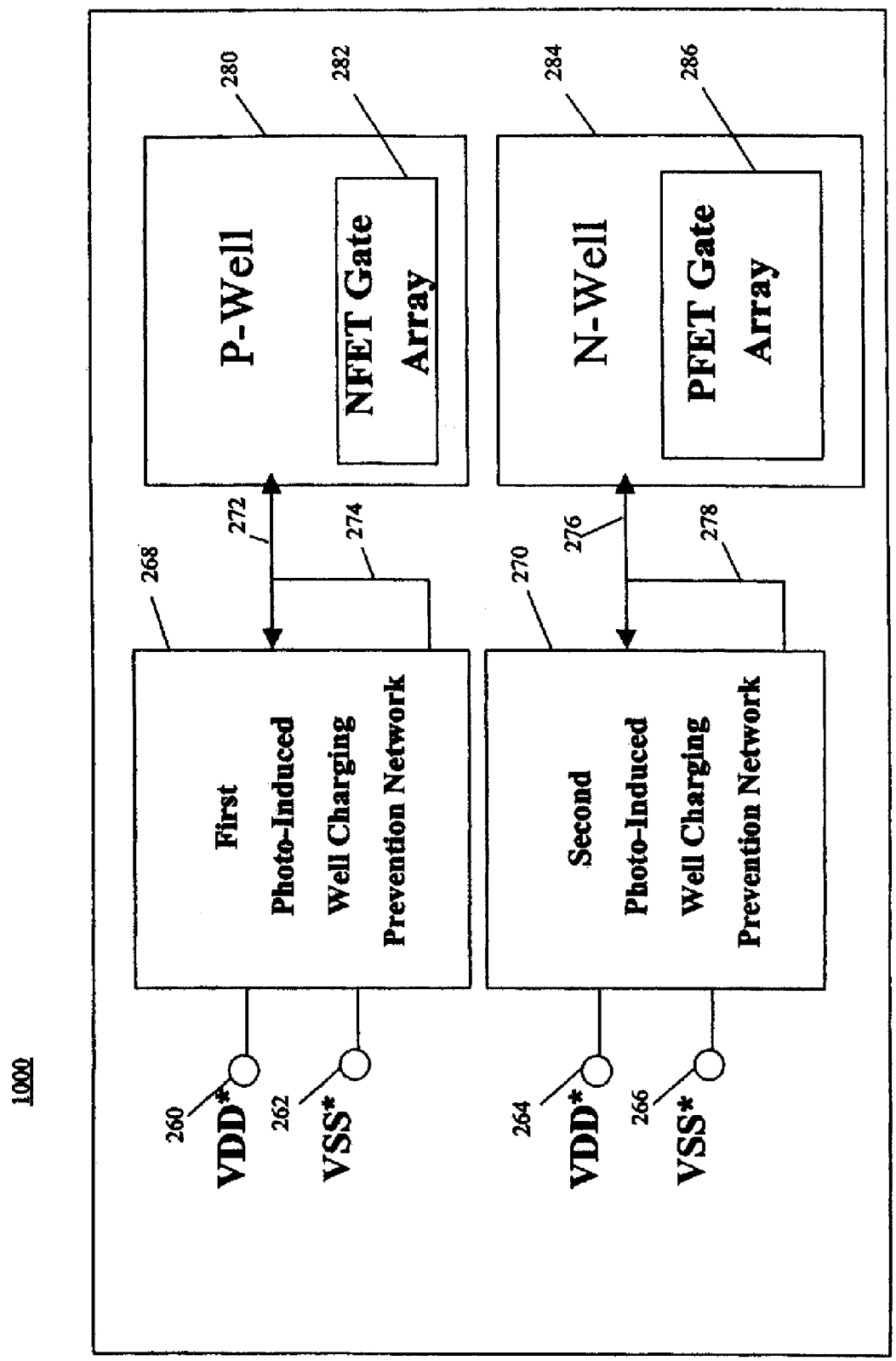
FIG. 10 is an illustration of a photo-induced well charging prevention network gate array structure in accordance with the invention.

Referring to FIG. 10, a photo-induced well charging prevention network gate array structure 1000 is schematically shown. The photo-induced well charging prevention network gate array structure 1000 includes a VDD* 260 input and a VSS* 262 input connected to a first photo-induced well charging prevention network 268. The first photo-induced well charging prevention network 268 is connected to a P-well 280 having an nFET gate array 282 formed therein, via a P-well connector 272. A gate connector 274 connects the P-well connector 272 to the first photo-induced well charging prevention network 268.

Also included in the photo-induced well charging prevention network gate array structure 1000 is second VDD* input 264 and second VSS* 266 input connected to a second photo-induced well charging prevention network 270. The second photo-induced well charging prevention network 270 is connected to an N-well 284 through an N-well connector 276. The N-well 284 has a pFET gate array 286 formed therein.

The N-well connector 276 connects the N-well 284 to the second photo-induced well charging prevention network 270. Additionally, a gate connector 278 connects the N-well connector 276 and the second photo-induced well charging prevention network 270.

In operation, the photo-induced well charging prevention network gate array structure 1000 has each of its components functioning as a structure in a manner similar to the individual functioning of the various embodiments described above. Accordingly, the first photo-induced well charging prevention network 268 blocks dendrite-forming current from passing from the P-well 280 to the VDD* connector 262 thus preventing or reducing dendrite formation thereon. Additionally, the second photo-induced well charging prevention network 270 blocks dendrite-forming current from passing from the N-well 284 to the VSS* input 264, thus preventing dendrite formation thereon. After fabrication, the first and second photo-induced well charging prevention networks, 268 and 270, will transition to the "on" state when receiving a signal at their respective inputs.

Figure 11:
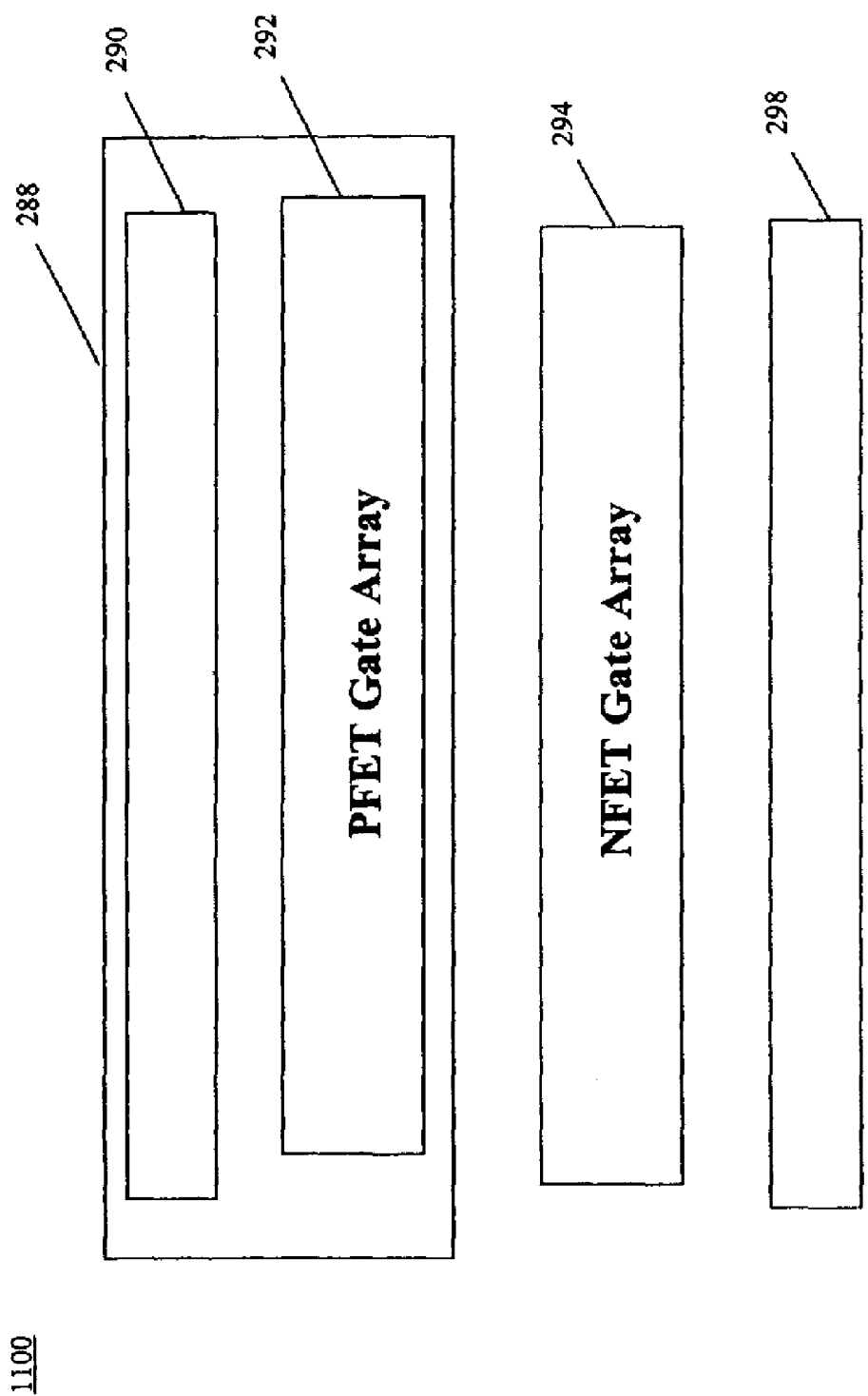
FIG. 11 is an illustration of a photo-induced well charging prevention network and well contact in accordance with the invention.

Referring to FIG. 11, a photo-induced well charging prevention network and well contact 1100 is shown in cross section. The photo-induced well charging prevention network and well contact 1100 includes at the bottom a substrate contact 298. Arranged above the substrate contact 298 is a nFET gate array 294. Arranged above the nFET gate array 294 is a combination 288 of a second photo-induced well charging prevention network and well contact 290 and pFET gate array 292.

While the invention has been described in terms of exemplary embodiments, those skilled in the art will recognize that the invention can be practiced with modifications and in the spirit and scope of the appended claims.

What is claimed is:

1. A dendrite control circuit, comprising:
a first source/drain region of a semiconductor switch in electrical communication with a first side of a charge source;
a gate region of the semiconductor switch in electrical communication with a second side of the charge source; and
a second source/drain region of the semiconductor switch in electrical communication with a dendrite forming conductor.

2. The dendrite control circuit of claim 1, wherein the charge source comprises a semiconductor junction.

3. The dendrite control circuit of claim 2, wherein a charge is photo-induced at the semiconductor junction.

4. The dendrite control circuit of claim 1, wherein the semiconductor switch comprises a diode.

5. The dendrite control circuit of claim 1, wherein the semiconductor switch comprises at least any one of a pFET, an nFET and a diode.

6. The dendrite control circuit of claim 1, wherein the first side of the charge source comprises either an n-well diffusion region or a p-well diffusion region and the second side of the charge source comprises either a p-well diffusion region or an n-well diffusion region, respectively.

7. The dendrite control circuit of claim 1, wherein the first source/drain region of the semiconductor switch comprises a p diffusion region and the first side of the charge source comprises an n diffusion region.

* * * * *